United States Patent [19]
Ha et al.

[11] Patent Number: 5,897,334
[45] Date of Patent: Apr. 27, 1999

[54] METHOD FOR REPRODUCING PRINTED CIRCUIT BOARDS FOR SEMICONDUCTOR PACKAGES INCLUDING POOR QUALITY PRINTED CIRCUIT BOARD UNITS AND METHOD FOR FABRICATING SEMICONDUCTOR PACKAGES USING THE REPRODUCED PRINTED CIRCUIT BOARDS

[75] Inventors: Sun Ho Ha; Young Wook Heo, both of Kungki-do; Byung Joon Han, Seoul, all of Rep. of Korea

[73] Assignees: Anam Semiconductor, Inc., Seoul, Rep. of Korea; Amkor Technology, Inc., Chandler, Ariz.

[21] Appl. No.: 08/951,062

[22] Filed: Oct. 15, 1997

[30] Foreign Application Priority Data

Oct. 19, 1996 [KR] Rep. of Korea ............. 96-46948

[51] Int. Cl.⁶ ............................................. H01L 21/44
[52] U.S. Cl. ........................... 438/107; 438/4; 438/15
[58] Field of Search ............................ 438/4, 14, 15, 438/17, 18, 107

[56] References Cited

U.S. PATENT DOCUMENTS

| | | | |
|---|---|---|---|
| 4,830,985 | 5/1989 | Araghi et al. | 438/4 |
| 5,137,836 | 8/1992 | Lam | 438/4 |
| 5,149,662 | 9/1992 | Eichelberger | 438/107 |
| 5,563,076 | 10/1996 | Takahashi | 438/15 |
| 5,700,697 | 12/1997 | Dlugokecki | 438/15 |

*Primary Examiner*—Kevin M. Picardat
*Attorney, Agent, or Firm*—Skjerven Morrill MacPherson Franklin & Friel LLP; Thomas S. MacDonald

[57] ABSTRACT

A method for reproducing a PCB strip for semiconductor packages, wherein a poor quality PCB unit included in the PCB strip is replaced with a normal quality one, thereby achieving a reduction in the amount of package materials used and an improvement in the process efficiency. The invention also provides a method for fabricating semiconductor packages using the PCB strip reproduction method. A desired portion of a poor quality PCB unit included in a PCB strip is cut out in such a manner that a cutting opening having a peripheral edge extending along the singulation line of the poor quality PCB unit or along a region defined between the singulation line and anti-bending slots of the poor quality PCB unit. In the cutting opening, a separate good quality PCB unit member having the same shape and size as the cutting opening is then fitted. Thus, it is possible to simply and efficiently replace PCB units determined to be of poor quality with separate good quality PCB unit members, respectively.

10 Claims, 8 Drawing Sheets

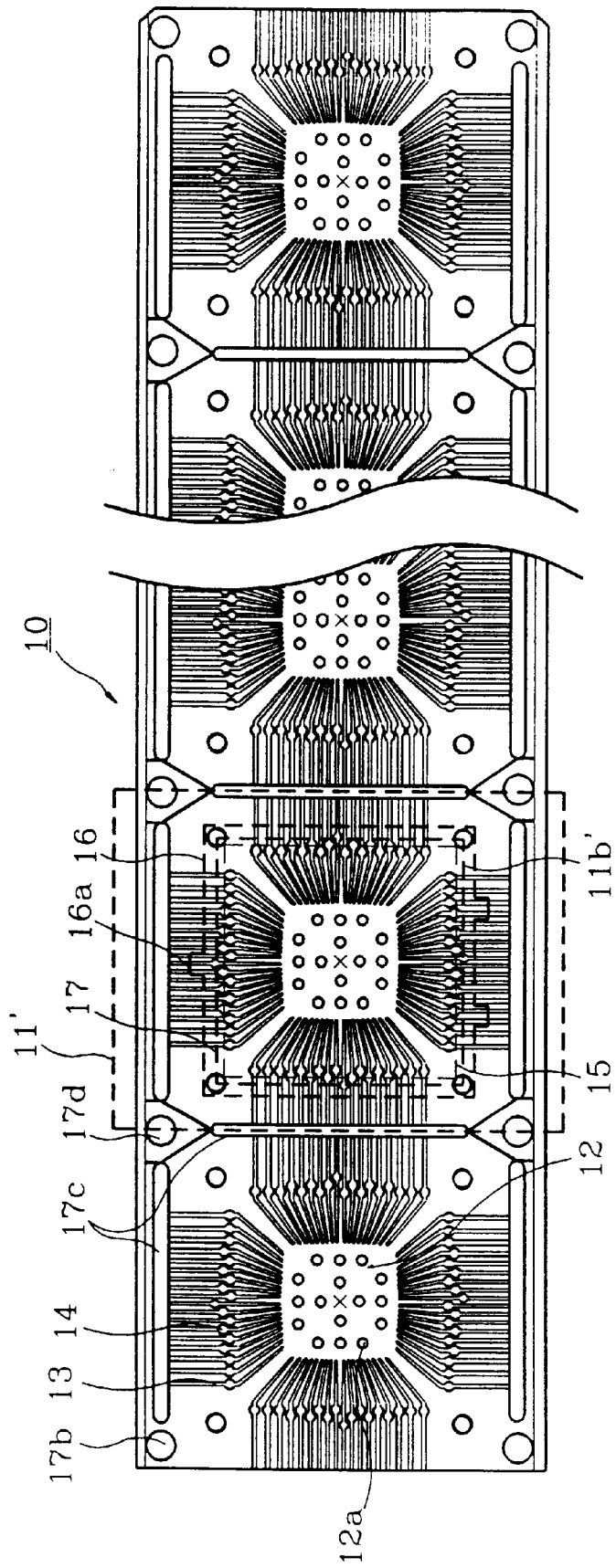

−PRIOR ART−

METHOD FOR REPRODUCING PRINTED CIRCUIT BOARDS FOR SEMICONDUCTOR PACKAGES INCLUDING POOR QUALITY PRINTED CIRCUIT BOARD UNITS AND METHOD FOR FABRICATING SEMICONDUCTOR PACKAGES USING THE REPRODUCED PRINTED CIRCUIT BOARDS

BACKGROUND OF THE INVENTION

1. Field of the Invention

The present invention relates to a method for reproducing a printed circuit board (PCB) for semiconductor packages including poor quality PCB units and a method for fabricating semiconductor packages using the reproduced PCB. More particularly, the present invention relates to a method for reproducing a PCB strip for semiconductor packages having a plurality of PCB units including at least one poor quality PCB unit, wherein the poor quality PCB unit is replaced with a normal quality one, thereby achieving a reduction in the amount of package materials used and an improvement in the process efficiency. The present invention also relates to a method for fabricating semiconductor packages using the above PCB strip reproduction method.

2. Related Art

Generally, PCBs are circuit boards mounted with electronic circuits such as semiconductor chips. Such PCBs are fabricated by forming strip-shaped thin conductive lines (conductive traces), which are to be electrically connected to input/output pads of, for example, a semiconductor chip, on a rigid or flexible insulating plate using a printing, plating or etching technique. In accordance with the arrangement of conductive lines, PCBs are classified into a one-sided type, a double-sided type and a multilayered type.

Such PCBs use a substrate comprised of a resin insulating plate coated with a conductive metal thin film. The coating of the conductive metal thin film is carried out using an etched foil method, in which a circuit pattern consisting of conductive traces is formed using an etching process, or an additive method, in which a conductive metal thin film is plated on a selected portion of the resin insulating plate where conductive traces are to be formed, thereby forming a circuit pattern.

Where PCBs are used, high density and high reliability of circuit lines are expected. In this regard, such PCBs sufficiently satisfy requirements for integrated circuits (IC) and large scale integrated circuits (LSI) using a large number of input/output terminals. For this reason, PCBs are widely used for a variety of semiconductor packages such as ball grid array packages, pin grid array packages and chip size packages.

Since the above-mentioned semiconductor packages, which use PCBs, have the same basic structure, the following description will be made in conjunction with only semiconductor packages of the ball grid array type which is a typical type for semiconductor packages. Ball grid array semiconductor, packages are semiconductor packages which have a structure typically including a PCB, at least one semiconductor chip mounted on the upper surface of the PCB, and an array of solder balls disposed on the surface of the PCB opposite to the surface attached with the semiconductor chip and adapted to transfer input and output signals associated with the semiconductor chip. Such ball grid array semiconductor packages are mainly used for multi-pinned devices having 200 pins or more, integrated circuits of very large scale integration (VLSI) and microprocessors.

FIG. 5 is a sectional view illustrating a typical ball grid array semiconductor package.

As shown in FIG. 5, the ball grid array semiconductor package, which is denoted by the reference numeral 1, includes a PCB 11a comprised of a resin substrate 18. A plurality of upper and lower conductive traces 13 are formed on the upper and lower surfaces of the resin substrate 18, respectively. The upper and lower conductive traces 13 are electrically connected through via holes 14. Upper and lower solder masks 19 are formed on the upper and lower surface of the PCB 11a, respectively. The upper solder mask is arranged on the outer portion of the upper surface of the PCB 11a except for the finger portions of the upper conductive traces. The lower solder mask is arranged on the entire lower surface of the PCB 11a except for solder ball pads adapted to fuse solder balls 40. However, the arrangements of the solder masks 13 are not limited to the above-mentioned case. The PCB 11a has a chip mounting region 12 at its central portion. At the chip mounting region 12, the PCB 11a is also provided with a plurality of through holes 12a adapted to easily discharge heat generated during the operation of the semiconductor chip 30. The through holes 12a also serve as ground or power via holes for the semiconductor chip 30. However, the provision of the throughout holes 12a is optional. At the chip mounting region 12, the resin substrate 18 may be exposed or coated with a metal thin film having a desired pattern.

The fabrication of the ball grid array semiconductor package 1 having the above-mentioned structure is carried out as follows. That is, the semiconductor chip 30 is first mounted on the central portion of the PCB 11a corresponding to the chip mounting region 12 by means of a silver-filled epoxy resin 33 which is an adhesive exhibiting a superior thermal conductivity (semiconductor chip mounting step). Thereafter, bond pads (not shown) of the mounted semiconductor chip 30 are electrically connected to the conductive traces 13 formed on the PCB 11a by bonding wires 31 (wire bonding step). A resin encapsulate 32 is then molded on the PCB 11a to protect the semiconductor chip 30 and bonding wires 31 from the environment (resin seal molding step). A plurality of solder balls serving as input/output terminals are then fused on the lower surface of the PCB 11a (solder ball fusing step). The solder balls 40 are electrically connected to the bond pads of the semiconductor chip 30, respectively. Although FIG. 5 illustrates the case having a simple PCB configuration in which one PCB sheet is used, a multilayer PCB configuration may be used which uses a plurality of laminated PCB sheets to obtain an increased solder ball density per unit area.

The PCB 11a, which is used to fabricate a ball grid array semiconductor package, is available from a PCB strip. Such a PCB strip is illustrated in FIG. 6. As shown in FIG. 6, the PCB strip, which is denoted by the reference numeral 10, has a plurality of PCB units 11 arranged on a single plane in the form of a strip. After the completion of the solder ball fusing step, the PCB units 11 of the PCB strip 10 are cut along the cut lines 16 so that they are separated from one another, thereby producing individual semiconductor packages 1. This step is called a "singulation step".

Each PCB unit 11 is defined with a chip mounting region 12 at the central portion of its upper surface. Each PCB unit 11 is also provided at its upper surface with a plurality of conductive traces 13 respectively having via holes 14. The conductive traces 13 are arranged around the chip mounting region 12. The conductive traces 13 are plated with gold or silver at their inner portions (that is, finger portions) to achieve an easy wire bonding to the bond pads of a semiconductor chip mounted on the PCB unit 11. Optionally, heat-discharging through holes 12a are formed in the portion of the PCB unit 11 corresponding to the chip mounting region 12. In FIG. 6, the thin broken line 15 indicates a resin encapsulate molding region where a resin encapsulate is molded whereas the thick broken line indicates a singulation line 17 along which semiconductor packages, obtained after the completion of the resin encapsulate molding and solder ball fusing steps, are cut so that they are separated from one another. Generally, singulation-assistant holes 17a are provided at the four corners of each singulation line 17 which has a square shape. The PCB strip 10 is also provided at both side portions thereof with slots 17b for receiving feeding pins, respectively. By virtue of such slots 17b, the PCB strip 10 can be accurately fed along a required process line while being easily fixed at an accurate processing position. An anti-bending slot 17c is formed in the PCB strip 10 between adjacent PCB units 11. The anti-bending slot 17c serves to prevent the PCB strip 10 from being permanently bent under high temperature and/or high pressure conditions involved in the resin adhesive curing, wire bonding and molding processes.

The reason why such a PCB strip is used in the fabrication of ball grid array semiconductor packages is to improve the process efficiency in the fabrication of semiconductor packages. The use of such a PCB strip enables an accurate feeding of semi-processed products to accurate positions for required processes and a simultaneous and multiple processing for a plurality of PCB units. For this reason, in the manufacture of semiconductor packages, the process flow thereof is conducted for every PCB strip.

Where such a PCB strip is used for the fabrication of ball grid array semiconductor packages, it is necessary to check individual PCB units of the PCB strip in order to find poor quality PCB units involving a short circuit or a degraded appearance. Such poor units should be distinguished from good units by marking those poor units with a particular sign so as to prevent the poor units from being mounted with expensive semiconductor chips or from being subjected to the wire bonding process. Practically, the rate of poor quality PCB units in one PCB strip is relatively high. Where only the good PCB units are subjected to the processes for the fabrication of semiconductor packages, it is possible to reduce the manufacturing costs.

However, poor quality PCB units or semi-processed product units involving a degradation during the processing thereof are processed along with good quality PCB units or semi-processed product units involving no degradation, until the fabrication of semiconductor packages is completed. As a result, the waste of package materials and processing efforts occurs. Poor quality semiconductor packages resulting from such poor quality PCB units or semi-processed product units are sorted only after the fabrication of semiconductor packages is completed. However, this sorting is also troublesome. This work rather results in a reduction in the throughput and productivity of semiconductor packages.

SUMMARY OF THE INVENTION

Therefore, an object of the invention is to provide a method for reproducing a PCB strip for semiconductor packages having a plurality of PCB units including at least one poor quality PCB unit, wherein the poor quality PCB unit is replaced with a normal quality one, thereby achieving a reduction in the amount of package materials used and an improvement in the process efficiency.

Another object of the invention is to provide a method for fabricating semiconductor packages in accordance with the reproduction method accomplishing the first object of the invention, which is capable of achieving an improvement in the throughput and productivity of semiconductor packages.

In accordance with the present invention, these objects are accomplished by cutting out a desired portion of a poor quality PCB unit included in a PCB strip, thereby forming a cutting opening, and fitting, in the cutting opening, a separate good quality PCB unit member having the same shape and size as the cutting opening.

That is, the present invention provides a method for reproducing printed circuit board (PCB) units for semiconductor packages, comprising: a PCB checking step of checking each PCB unit of a PCB strip including a plurality of PCB units aligned together and respectively configured to have a resin substrate, a plurality of conductive traces formed on an upper surface or upper and lower surfaces of the resin substrate, and a central semiconductor chip mounting region defined by respective ends of the conductive traces facing a central portion of the resin substrate; a poor quality PCB unit cutting step of cutting out a desired portion of a poor quality PCB unit determined at the PCB checking step to be of poor quality, along a cutting line extending along a singulation line of the poor quality PCB unit or along a linear region defined outside the singulation line, thereby forming a cutting opening in the PCB strip; and a good quality PCB unit member fitting step of fitting, in the cutting opening, a separate good quality PCB unit member having the same shape and size as the cutting opening.

BRIEF DESCRIPTION OF THE DRAWINGS

Other objects and aspects of the invention will become apparent from the following description of embodiments with reference to the accompanying drawings in which:

FIGS. 2A and 2B are plan views respectively illustrating other cutting structures for poor PCB units;

DESCRIPTION OF THE PREFERRED EMBODIMENTS

Figure 1:
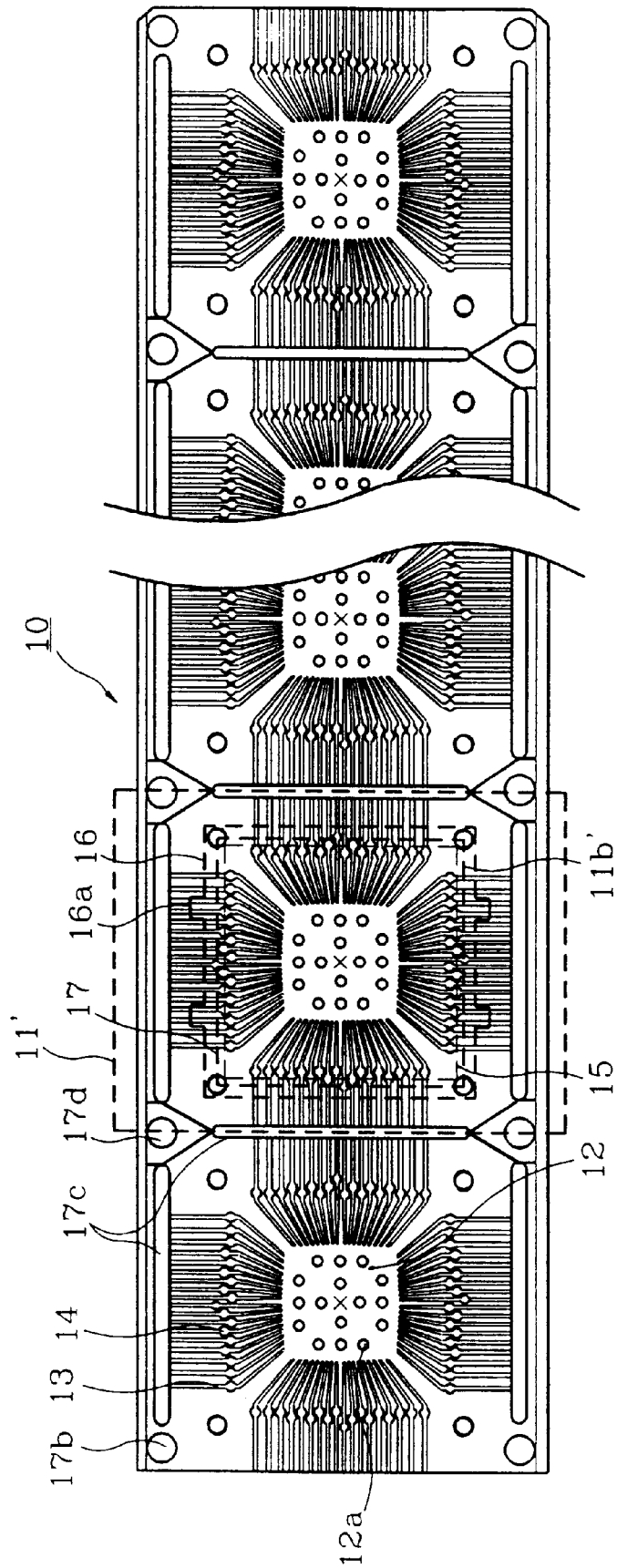
FIG. 1 is a plan view illustrating a PCB strip for semiconductor packages in which poor quality PCB units exist.

FIG. 1 illustrates a PCB strip for semiconductor packages in which poor quality PCB units exist. As shown in FIG. 1, the PCB strip, which is denoted by the reference numeral 10, includes a plurality of PCB units 11 (typically, four to eight units) arranged in the form of a strip. In FIGS. 1, poor quality PCB units are denoted by the reference numeral 11'. In order to cut out such poor quality PCB units 11' from the PCB strip 10, a phantom cutting line 16 is formed on each poor quality PCB unit 11'. The phantom cutting line 16 is adapted to form a cutting opening having a peripheral edge extending along the singulation line 17 of the poor quality PCB unit 11' or along a region defined between the singulation line 17 and anti-bending slots 17c of the poor quality PCB unit 11'.

Figure 6:
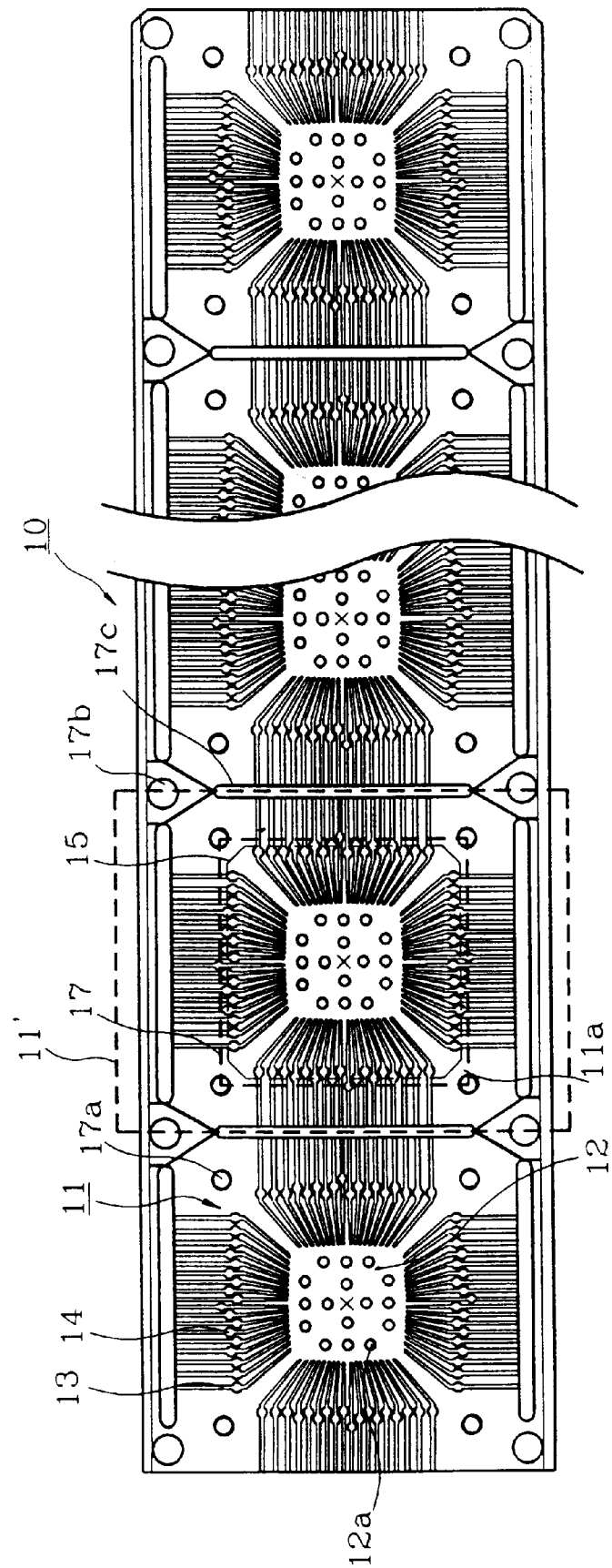
FIG. 6 is a plan view illustrating a PCB strip f or semiconductor packages including poor quality PCB units.

Since the configuration of normal PCB units 11 shown in FIG. 1 is the same as that in FIG. 6, its description will be omitted.

Where such a PCB strip is used for the fabrication of semiconductor packages, individual PCB units 11 of the PCB strip are checked to find poor quality PCB units involving a short circuit of conductive traces 13 finely patterned on the PCB units or a degraded appearance (PCB checking step). In order to cut out such poor quality PCB units 11' from the PCB strip 10, a cutting process is then carried out for each poor quality PCB unit 11' along a phantom cutting line 16 extending along the singulation line 17 of the poor quality PCB unit 11' or along a region defined between the singulation line 17 and anti-bending slots 17c of the poor quality PCB unit 11', thereby forming a cutting opening (denoted by the reference numeral 16' in FIG. 3A) (poor quality PCB unit cutting step). A separate good quality PCB unit member will be fitted in the cutting opening. This will be described hereinafter.

The phantom cutting line 16 may have any shape such as a square shape, a rectangular shape, a hexagonal shape, an octagonal shape or a circular shape, in so far as it is arranged along a region defined between the singulation line 17 (typically having a square shape) and anti-bending slots 17c of the associated poor quality PCB unit 11'. However, it is desirable that the cutting line 16 is arranged in such a manner that the singulation-assistant holes 17a exist in a region defined by the cutting line 16. In this case, an easy singulation process can be achieved.

Preferably, the cutting line 16 has at least one key or tooth-shaped portion 16a to form a cutting opening having a key or tooth. In this case, a separate good quality PCB unit member 11b (FIG. 3B), which is to be fitted in the cutting opening, is configured to have a key or tooth mated with the key or tooth of the cutting opening. By virtue of such a key structure, an enhanced fitting force is obtained between the cutting opening and the PCB unit 11b fitted in the cutting opening. In particular, the cutting opening has an increased periphery length by virtue of the key structure, so that the area of the peripheral edge of the cutting opening contacting the peripheral edge of the good quality PCB unit member fitted in the cutting opening increases. Accordingly, the good quality PCB unit member can be more firmly maintained in the cutting opening.

In the case illustrated in FIG. 1, the cutting line 16 has a square shape while having rectangular key portions 16a symmetrically arranged in pairs on two opposite sides thereof. The number, shape and position of such key portions 16a of the cutting line 16 are optional. For example, the key portions 16a may have a triangular shape, a square shape or circular shape.

For each poor quality PCB unit 11' determined to be of poor quality, a cutting process is carried out to cut out a portion of the PCB unit 11' corresponding to a region defined by the cutting line 16. In FIG. 4B, the cut-out poor quality PCB unit portion is denoted by the reference numeral 11b'. Thus, a cutting opening 16' is left in the poor quality PCB unit 11' after the completion of the cutting process, as shown in FIG. 3A.

Figure 2B:
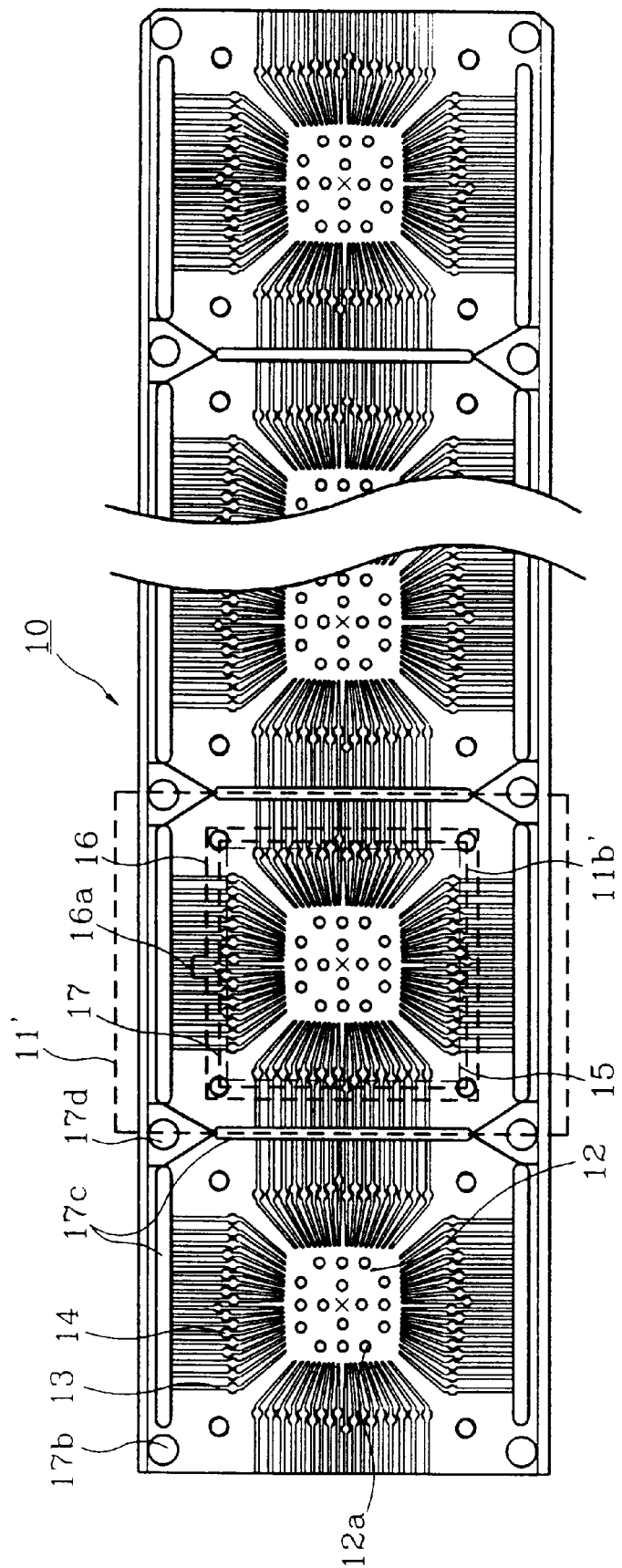

FIGS. 2A and 2B illustrate other cutting structures for poor PCB units 11', respectively. These cutting structures are basically identical to that of FIG. 1 except for only the number and position of key portions 16a. Accordingly, the cutting structures will be described only in conjunction with the above-mentioned difference.

In the case of FIG. 2A, the cutting line 16 has a single key portion 16a on one of opposite sides thereof and a pair of key portions 16a on the other side thereof. That is, the cutting line 16 of FIG. 2A has an asymmetrical key arrangement. In the case of FIG. 2B, the cutting line 16 has a single key portion 16a on only one side thereof. In either case, an additional effect is provided in that a separate good quality PCB unit member (denoted by the reference numeral 11b in FIG. 3B) can be fitted in a cutting opening (denoted by the reference numeral 16' in FIG. 3A) formed after the completion of the cutting process for a poor quality PCB unit, without causing the positions of the sides thereof to be changed from one another.

Figure 3A:
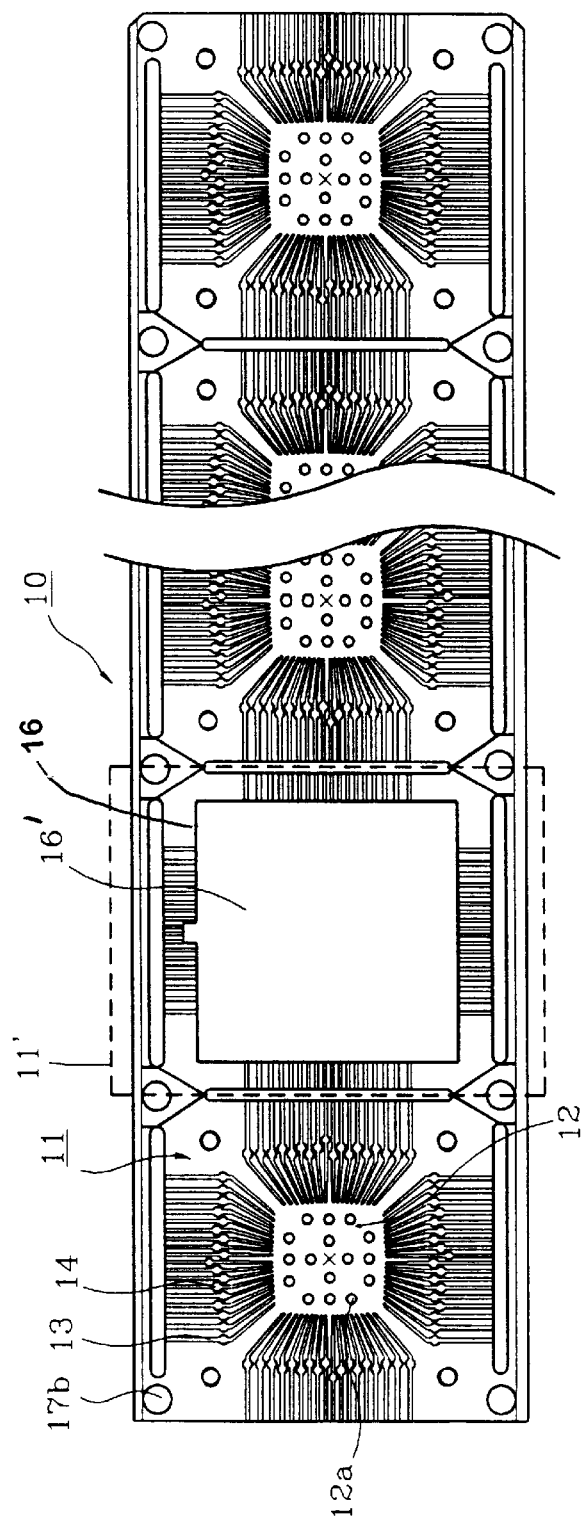
FIG. 3A is a plan view illustrating a state in which a desired portion of a poor quality PCB unit included in a PCB strip is removed from the PCB strip to form a cutting opening having a shape as shown in FIG. 2B.

FIG. 3A is a plan view illustrating a state in which a large portion of a poor quality PCB unit 11' included in a PCB strip 10 is removed from the PCB strip 10 to form a cutting opening having a shape as shown in FIG. 2B. That is, after a poor quality PCB unit portion 11b' is cut out, a cutting opening 16' is left in the poor quality PCB unit 11'. The cutting process for the poor quality PCB unit may be carried out using various kinds of cutters. However, it is desirable in terms of the costs to use the same cutter as that used in the singulation process.

Figure 3B:
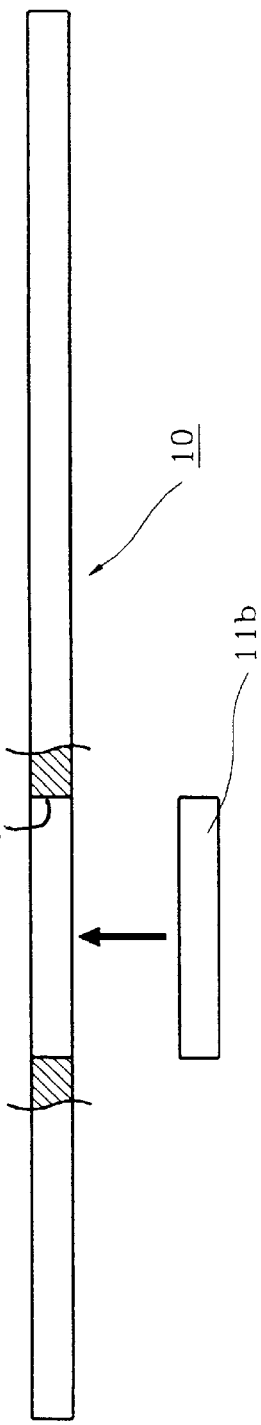
FIG. 3B is a schematic view illustrating a method for reproducing a PCB strip including poor quality PCB units in accordance with the present invention, in which a separate good quality PCB unit member is fitted in the cutting opening of FIG. 3A.

FIG. 3B is a schematic view illustrating a method for reproducing a PCB strip including poor quality PCB units in accordance with the present invention. In accordance with the PCB strip reproduction method of the present invention, a large portion of a poor quality PCB unit 11' included in a PCB strip 10 is removed from the PCB strip 10, thereby forming a corresponding cutting opening 16' in the PCB strip 10. A separate good quality PCB unit member having the same shape and size as the cutting opening 16' is then fitted in the cutting opening 16' (good quality PCB unit member fitting step).

That is, the PCB strip reproduction method of the present invention involves the PCB checking step, poor quality PCB unit cutting step and good quality PCB unit member fitting step. Now, the good quality PCB unit member fitting step will be described.

Here, the clause "the good quality PCB unit member 11b has the same shape and size as the cutting opening 16'" means that the PCB unit member 11b has a shape and a size enabling it to be normally processed during the PCB unit member fitting step without causing the conductive traces finely formed on the PCB unit member 11b to be damaged due to an excessive or forced fitting force or during subsequent processing steps for fabricating a semiconductor package, namely, a semiconductor chip mounting step, a wire bonding step and a molding step, without its partial or complete separation from the PCB strip 10, thereby fabricating a normal semiconductor package.

Once the PCB unit member 11b having the same shape and size as the cutting opening 16' is fitted in the cutting opening 16', it is difficult for the PCB unit member 11b to be separated from the cutting opening 16' so long as no excessive force is applied to the PCB unit member 11b. This is because the peripheral surface of the cutting hole 16' and the peripheral surface of the PCB unit member 11b including the cut surfaces of a resin substrate, solder masks and conductive traces are formed with burrs so that they are in a rough state. Accordingly, although semiconductor packages are fabricated using the PCB strip 10 which includes PCB units reproduced by fitting separate PCB unit members 11b in cutting openings 16' left after the removal of poor quality PCB units, the package fabrication process can be normally carried out.

Figure 4A:
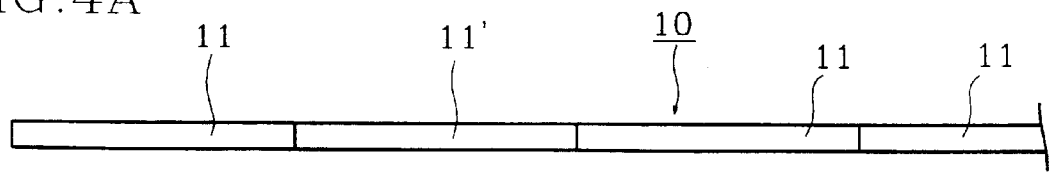
FIGS. 4A to 4H are schematic views respectively illustrating sequential steps of a method for fabricating semiconductor packages carried out using the PCB strip reproduction method according to the present invention.
Figure 4B:
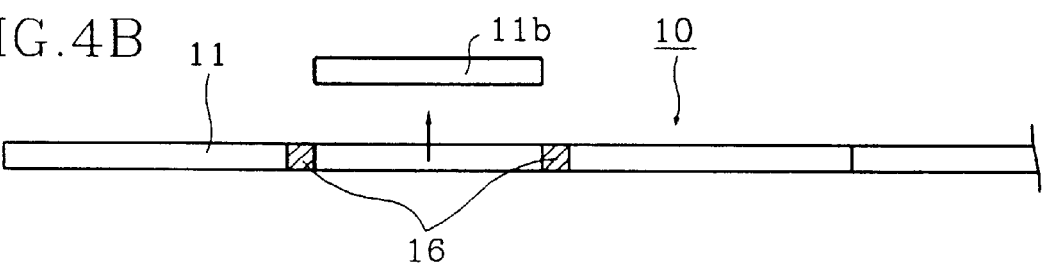
Figure 4C:
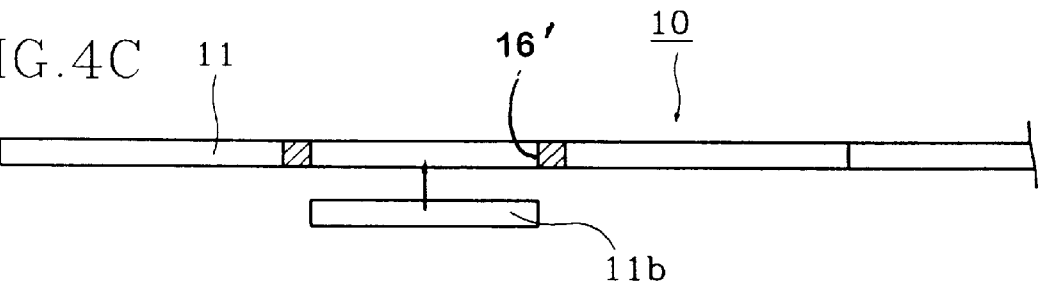
Figure 4D:
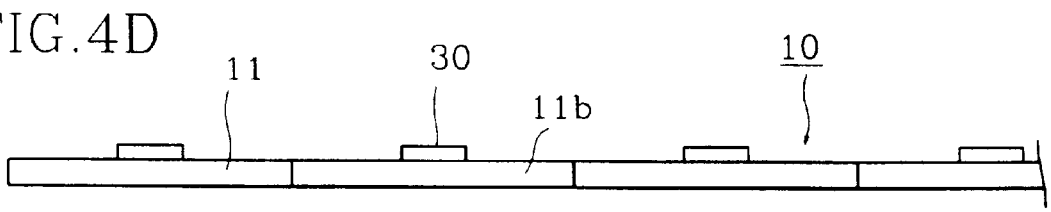
Figure 4E:
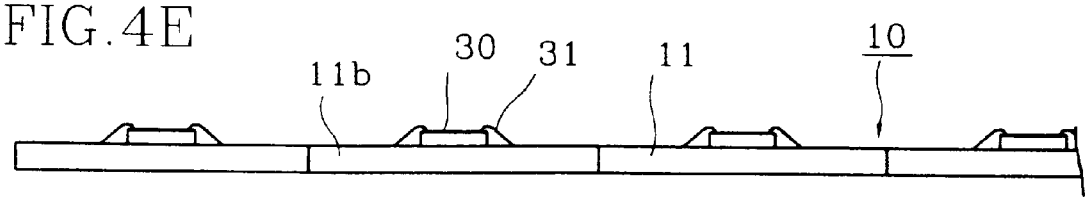
Figure 4F:
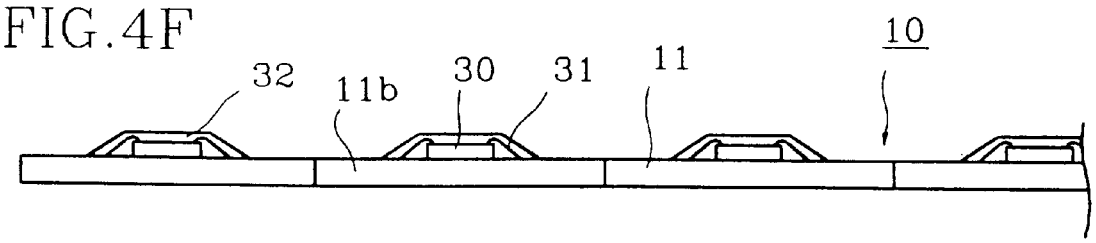
Figure 4G:
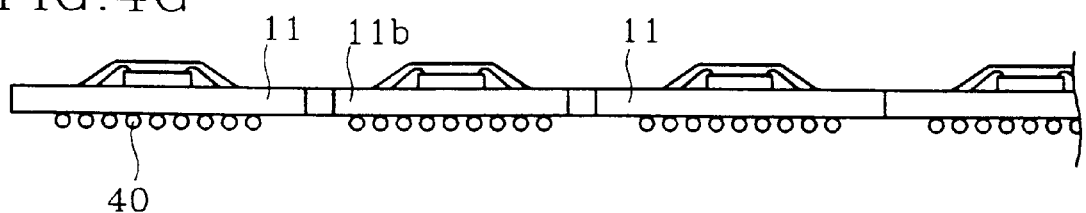
Figure 4H:
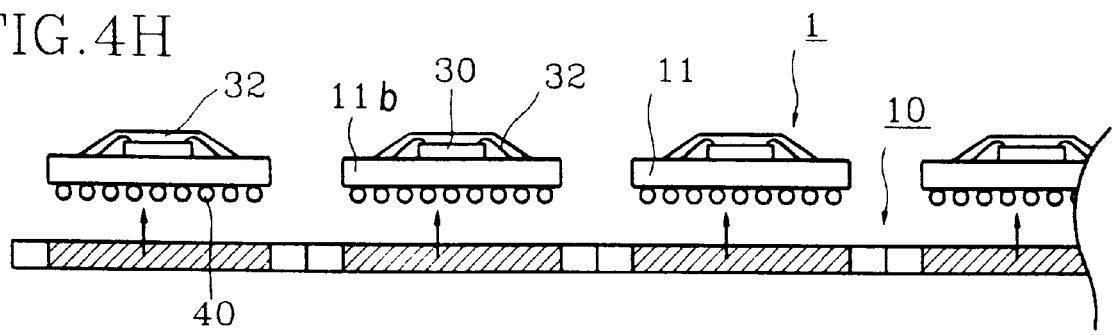
Figure 5:
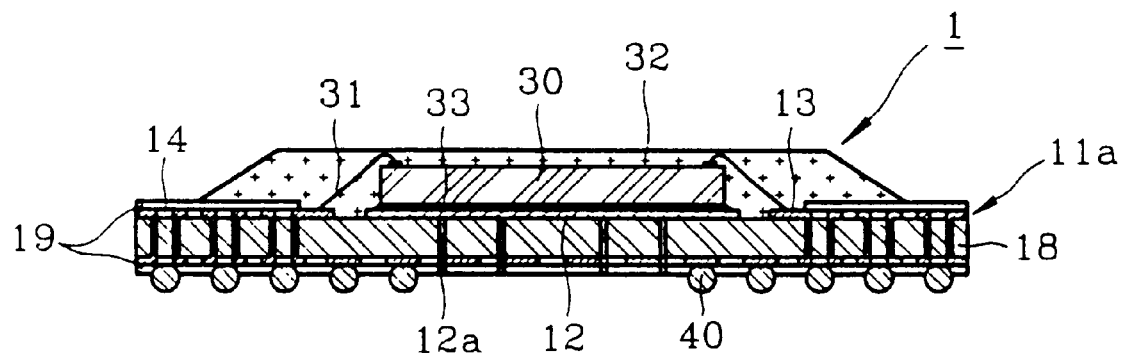
FIG. 5 is a sectional view illustrating a typical ball grid array semiconductor package fabricated using a PCB unit.

FIGS. 4A to 4H are schematic views respectively illustrating sequential steps of a method for fabricating semiconductor packages carried out using the PCB strip reproduction method according to the present invention. The semiconductor package fabrication method of the present invention involves the following processing steps:

Step 1 (PCB checking step): Step of checking a short circuit or a degraded appearance occurring at conductive traces 13 and via holes 14 finely patterned on each of four to eight PCB units 11 included in a PCB strip 10 for semiconductor packages obtained as FIG. 6 (FIG. 4A);

Step 2 (poor quality PCB cutting step): Step of cutting out a large portion (denoted by the reference numeral 11b') of a poor quality PCB unit 11' determined at the PCB checking step to be of poor quality, along a phantom cutting line 16 extending along the singulation line 17 of the poor quality PCB unit 11' or along a region defined between the singulation line 17 and anti-bending slots 17c of the poor quality PCB unit 11', thereby forming a cutting opening 16 in the PCB strip (FIG. 4B);

Step 3 (good quality PCB unit member fitting step): Step of fitting, in the cutting opening 16', a separate good quality PCB unit member 11b having the same shape and size as the cutting opening 16' (FIG. 4C);

Step 4 (semiconductor chip mounting step): Step of bonding semiconductor chips 30 to chip mounting regions 12 defined on respective central portions of all the PCB units including the fitted PCB unit member 11b by means of a silver-filled epoxy resin 33 which is an adhesive exhibiting a superior thermal conductivity (FIG. 4D);

Step 5 (wire bonding step): Step of bonding input/output pads (not shown) of the mounted semiconductor chip 30 to the conductive traces 13 formed on the PCB units by bonding wires 31, thereby electrically connecting the input/output pads and conductive traces 13 (FIG. 4E);

Step 6 (resin encapsulate molding step): Step of molding resin encapsulates 32 on portions of the PCB units (denoted by the reference numeral 15 in FIG. 1) to protect the semiconductor chips 30 and bonding wires 31 from the environment (FIG. 4F);

Step 7 (solder ball fusing step): Step of fusing a plurality of solder balls serving as input/output terminals on the lower surface of each of the PCB units including the fitted PCB unit member 11b (FIG. 4G); and Step 8 (singulation step): Step of cutting the PCB strip 10 into individual PCB units along the singulation lines 17 passing singulation-assistant holes 17a, thereby producing individual semiconductor packages 1 (FIG. 4H).

Although the semiconductor package fabrication method using the PCB strip reproduction method according to the present invention involves the above-mentioned eight processing steps in the case wherein semiconductor packages to be fabricated are of the ball grid array type, the solder ball fusing step (Step 7) may be eliminated in the case wherein semiconductor packages to be fabricated are of the pin grid array type.

In accordance with the semiconductor package fabrication method of the present invention, the state of the semiconductor chip 30 mounted on each PCB unit 11 may be checked after the completion of the semiconductor chip mounting step, namely, Step 4. In this case, Steps 2 and 3, namely, the poor quality PCB cutting step and good quality PCB unit member fitting step, may be carried out in order to remove poor quality PCB units 11' determined to be of poor quality and to replace the poor quality PCB units 11' by separate good quality PCB unit members on which semiconductor chips 30 are mounted in a good quality state, respectively.

In accordance with the semiconductor package fabrication method of the present invention, the wire bonding state of the PCB units 11 may also be checked after the completion of the wire bonding step, namely, Step 5. In this case, Steps 2 and 3, namely, the poor quality PCB cutting step and good quality PCB unit member fitting step, may also be carried out in order to remove poor quality PCB units 11' determined to be of poor quality and to replace the poor quality PCB units 11' with separate good quality PCB unit members in which bonding wires 31 are in a good quality state along with semiconductor chips 30.

As apparent from the above description, in accordance with the present invention, it is possible to simply and efficiently replace PCB units determined to be of poor quality with separate good quality PCB unit members, respectively. Accordingly, an improvement in the throughput and productivity of semiconductor packages is achieved. A reduction in the amount of package materials used is also obtained.

Although the present invention has been described in conjunction with PCB strips for ball grid array semiconductor packages, it is not limited to such PCB strips for ball grid array semiconductor packages. The present invention can be also applied to PCB strips for pin grid array semiconductor packages or chip scale semiconductor packages. Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for reproducing printed circuit board (PCB) units for semiconductor packages, comprising:

a PCB checking step of checking each PCB unit of a PCB strip including a plurality of PCB units aligned together and respectively configured to have a resin substrate, a plurality of conductive traces formed on an upper surface or upper and lower surfaces of the resin substrate, and a central semiconductor chip mounting region defined by respective ends of the conductive traces facing a central portion of the resin substrate;

a poor quality PCB unit cutting step of cutting out a desired portion of a poor quality PCB unit determined at the PCB checking step to be of poor quality, along a cutting line extending along a singulation line of the poor quality PCB unit or along a linear region defined outside the singulation line, thereby forming a cutting opening in the PCB strip; and a good quality PCB unit member fitting step of fitting, in the cutting opening, a separate good quality PCB unit member having the same shape and size as the cutting opening.

2. The method in accordance with claim 1, wherein the conductive traces are formed on both the upper and lower surfaces of the resin substrate.

3. The method in accordance with claim 1, wherein the cutting opening has a shape selected from the group consisting of a square shape, a rectangular shape, a hexagonal shape, an octagonal shape, and a circular shape.

4. The method in accordance with claim 1, wherein the cutting opening is provided with a peripheral edge thereof with at least one key portion having a square, rectangular, triangular or semicircular shape and serving to enhance a fitting force for the separate good quality PCB unit member.

5. The method in accordance with claim 4, wherein at the poor quality PCB unit cutting step, an even number of key portions are formed in an asymmetrical manner so that when the good quality PCB unit member is fitted in the cutting opening, the positions of the sides thereof are not changed from one another.

6. A method for fabricating semiconductor packages, comprising the steps of:

a PCB checking step of checking each PCB unit of a PCB strip including a plurality of PCB units aligned together and respectively configured to have a resin substrate, a plurality of conductive traces formed on an upper surface or upper and lower surfaces of the resin substrate, and a central semiconductor chip mounting region defined by respective ends of the conductive traces facing a central portion of the resin substrate;

a poor quality PCB unit cutting step of cutting out a desired portion of a poor quality PCB unit determined at the PCB checking step to be of poor quality, along a cutting line extending along a singulation line of the poor quality PCB unit or along a linear region defined outside the singulation line, thereby forming a cutting opening in the PCB strip; and a good quality PCB unit member fitting step of fitting, in the cutting opening, a separate good quality PCB unit member having the same shape and size as the cutting opening;

a semiconductor chip mounting step of bonding semiconductor chips to chip mounting regions defined on all the PCB units, respectively;

a wire bonding step of bonding the mounted semiconductor chip to the conductive traces formed on the PCB units by bonding wires, thereby electrically connecting the semiconductor chips to the conductive traces;

a resin encapsulate molding step of molding resin encapsulates on desired portions of the PCB units to protect the semiconductor chips and the bonding wires from the environment; and a singulation step of cutting the PCB strip into individual PCB units along the singulation lines.

7. The method in accordance with claim 6, further comprising a solder ball fusing step of fusing a plurality of solder balls serving as input/output terminals on the lower surface of each of the PCB units after the resin encapsulate molding step, but before the singulation step.

8. The method in accordance with claim 6, wherein the cutting opening has a shape selected from the group consisting of a square shape, a rectangular shape, a hexagonal shape, an octagonal shape, and a circular shape.

9. The method in accordance with claim 6, wherein the cutting opening is provided with a peripheral edge thereof with at least one key portion having a square, rectangular, triangular or semicircular shape and serving to enhance a fitting force for the separate good quality PCB unit member.

10. The method in accordance with claim 6, wherein at the poor quality PCB unit cutting step, an even number of key portions are formed in an asymmetrical manner so that when the good quality PCB unit member is fitted in the cutting opening, the positions of the sides thereof are not changed from one another.

* * * * *